(12) United States Patent
Geske et al.

(10) Patent No.: US 12,170,431 B2
(45) Date of Patent: Dec. 17, 2024

(54) ASSEMBLY HAVING A SOLDER PIN AND A SOLDER POINT

(71) Applicant: Phoenix Contact GmbH & Co. KG, Blomberg (DE)

(72) Inventors: Ralf Geske, Schieder-Schwalenberg (DE); Simon Follmann, Extertal (DE); Frank Karger, Schieder-Schwalenberg (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 431 days.

(21) Appl. No.: 17/612,583

(22) PCT Filed: May 25, 2020

(86) PCT No.: PCT/EP2020/064374
§ 371 (c)(1),
(2) Date: Nov. 19, 2021

(87) PCT Pub. No.: WO2020/234478
PCT Pub. Date: Nov. 26, 2020

(65) Prior Publication Data
US 2022/0239047 A1    Jul. 28, 2022

(30) Foreign Application Priority Data
May 23, 2019   (DE) .................... 10 2019 113 788.8

(51) Int. Cl.
*H01R 12/58*    (2011.01)
*B23K 1/00*     (2006.01)
(Continued)

(52) U.S. Cl.
CPC ....... *H01R 43/0256* (2013.01); *B23K 1/0008* (2013.01); *B23K 3/087* (2013.01);
(Continued)

(58) Field of Classification Search
None
See application file for complete search history.

(56) References Cited

U.S. PATENT DOCUMENTS 3,059,152 A    10/1962  Khouri
4,753,602 A *  6/1988   Peyrat .................. H01R 43/205
                                                        439/246
(Continued)

FOREIGN PATENT DOCUMENTS

DE    102016124072 A1   6/2018
EP         2235794 B1   2/2012
(Continued)

*Primary Examiner* — Tho D Ta
(74) *Attorney, Agent, or Firm* — Leydig, Voit & Mayer, Ltd.

(57) ABSTRACT

An assembly is provided. The assembly includes a component, a solder pin arranged on the component, an electrical structural unit, and a soldering point which is arranged on the electrical structural unit and forms an opening, into which the solder pin is insertable along an insertion direction in order to produce a soldered joint. The solder pin has an insertion portion which, on sides of the solder pin that face away from each other, forms insertion walls which are arranged at an acute angle to one another in such a way that the insertion portion tapers in the insertion direction. A part of the insertion portion is arranged outside the opening in such a way that one or more portions of the insertion walls extend inside the opening and one or more portions of the insertion walls extend outside the opening.

15 Claims, 5 Drawing Sheets

(51) Int. Cl.
*B23K 3/08* (2006.01)
*H01R 43/02* (2006.01)
*B23K 101/42* (2006.01)

(52) U.S. Cl.
CPC ......... *H01R 12/58* (2013.01); *H01R 43/0263* (2013.01); *B23K 2101/42* (2018.08); *H05K 2201/10803* (2013.01)

(56) References Cited

U.S. PATENT DOCUMENTS

| | | | |
|---|---|---|---|
| 4,894,911 A * | 1/1990 | Jones | H01R 43/20 29/842 |
| 5,208,968 A * | 5/1993 | Camsell | H01R 43/205 29/739 |
| 5,398,165 A | 3/1995 | Niinou | |
| 5,964,596 A * | 10/1999 | Vicich | H01R 43/205 439/943 |
| 6,593,535 B2 | 7/2003 | Gailus | |
| 8,007,292 B2 * | 8/2011 | Kunert | H05K 3/308 439/83 |
| 9,431,719 B2 * | 8/2016 | Braunger | H01R 4/02 |
| 2002/0058428 A1 | 5/2002 | Torii | |
| 2011/0039428 A1 | 2/2011 | Ludwig | |

FOREIGN PATENT DOCUMENTS

| | | |
|---|---|---|
| JP | H09330753 A | 12/1997 |
| JP | 2012134106 A | 7/2012 |

* cited by examiner

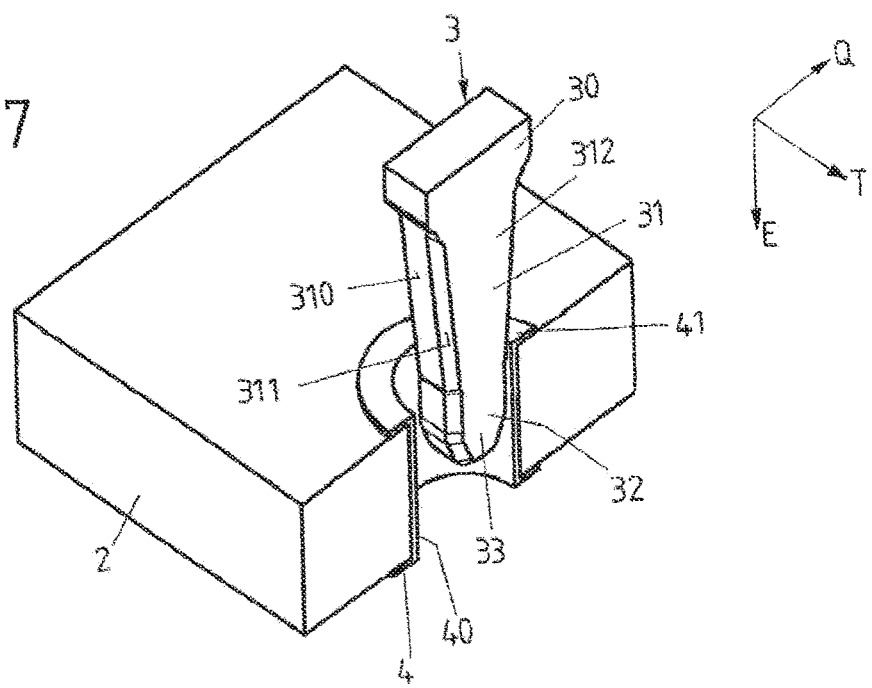
FIG 7
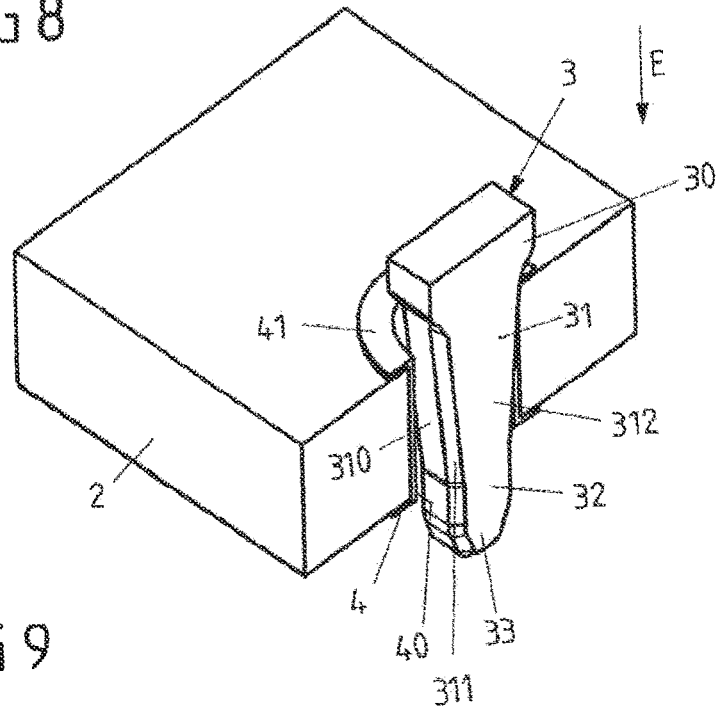
FIG 8
FIG 9
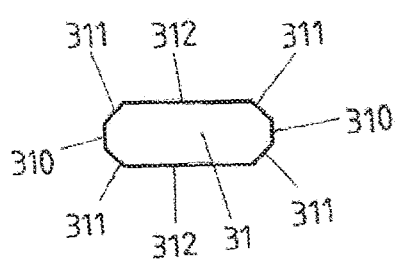

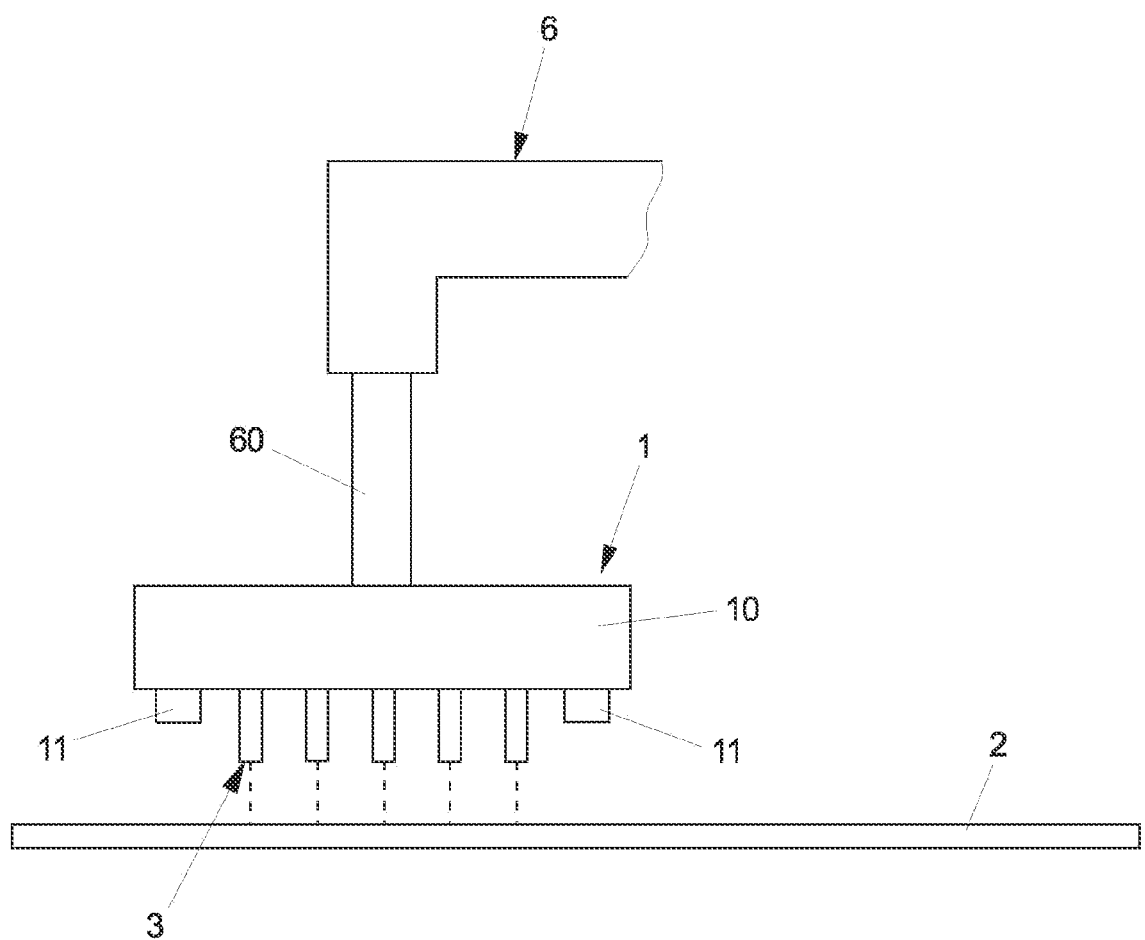

ASSEMBLY HAVING A SOLDER PIN AND A SOLDER POINT

CROSS-REFERENCE TO PRIOR APPLICATIONS

This application is a U.S. National Phase application under 35 U.S.C. § 371 of International Application No. PCT/EP2020/064374, filed on May 25, 2020, and claims benefit to German Patent Application No. DE 10 2019 113 788.8, filed on May 23, 2019. The International Application was published in German on Nov. 26, 2020 as WO 2020/234478 under PCT Article 21(2).

FIELD

The invention relates to an assembly and a method for producing such an assembly.

BACKGROUND

Such an assembly comprises a component, a solder pin arranged on the component, an electrical structural unit, and a soldering point arranged on the electrical structural unit and forming an opening into which the solder pin can be inserted along an insertion direction in order to produce a soldered joint.

Such an assembly can have, for example, a component to be fastened to an electrical structural unit in the form of a printed circuit board, for example a plug-in connector for connecting electrical conductors to the electrical structural unit. One or more solder pins can be arranged on such a component and, for fastening and electrically contacting the component with the electrical structural unit, are positioned at associated soldering points of the structural unit in order to then mechanically connect and electrically contact the solder pins to the soldering points by using a soldering method.

So-called through-hole reflow technology (THR) can be used as the soldering method, within the scope of which, for example, a solder paste is applied to a soldering point, then a solder pin is inserted into the opening of the soldering point, and the solder paste is subsequently melted in a melting process in a so-called reflow oven in order to produce a soldered joint.

Typical solder pins, in particular for use in through-hole reflow technology, for populating electrical structural units in the form of printed circuit boards with electrical or electronic components to be affixed thereto have a square or rectangular cross-sectional shape. The solder pins are to be inserted into associated openings of soldering points, which usually have a round shape and are dimensioned larger in their clear width than the solder pins.

In this context, the DIN EN 61760-3 standard relevant to THR technology stipulates a position tolerance of ±0.2 mm. It follows from such a position tolerance that a pin tip of the solder pin can be positioned within a circle with a diameter of 0.4 mm in the opening of the soldering point and only in the ideal case is arranged centrally in the opening of the soldering point.

Due to the existing tolerances, there is usually a clearance between a solder pin and an opening of a soldering point into which the solder pin is to be inserted. Under certain circumstances, such a clearance can lead to (slight) tilting of a component, for example on a printed circuit board, which can result in a component not being fixed in parallel to a printed circuit board edge or overall be fixed at an offset from an ideal nominal position on the printed circuit board, for example.

It is thus desirable to reduce tolerances between a solder pin and a soldering point for producing a soldered joint in order to enable precise positioning of components on an associated electrical structural unit, for example a printed circuit board.

DE 10 2016 124 072 A1 describes a contact device which comprises a closure means and a plug-in contact for contacting a circuit carrier, wherein the plug-in contact comprises a contact portion and a connecting portion. The contact portion adjoins a tip of the plug-in contact and is designed for contacting a metallized socket contact of the circuit carrier, wherein the connecting portion adjoins the contact portion on a side, facing away from the tip, of the contact portion and is connected to the contact portion.

In an arrangement known from EP 2 235 794 B1, a centering pin is arranged next to a solder pin, which centering pin is designed to lead and engages with an associated centering opening before the solder pin penetrates into an associated soldering point.

U.S. Pat. No. 6,593,535 describes an arrangement in which a conical pin is to be inserted into an associated recess.

SUMMARY

In an embodiment, the present invention provides an assembly, comprising: a component, a solder pin arranged on the component, an electrical structural unit, and a soldering point which is arranged on the electrical structural unit and forms an opening, into which the solder pin is insertable along an insertion direction in order to produce a soldered joint, wherein the solder pin has an insertion portion which, on sides of the solder pin that face away from one another, forms insertion walls which are arranged at an acute angle to one another in such a way that the insertion portion tapers in the insertion direction, wherein, when the soldered joint has been produced between the solder pin and the soldering point, a part of the insertion portion is arranged outside the opening in such a way that one or more portions of the insertion walls extend inside the opening and one or more portions of the insertion walls extend outside the opening.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 7 shows a perspective partial sectional view of the solder pin before insertion into the opening of the associated soldering point;

FIG. 8 shows the view according to FIG. 7 with the solder pin inserted;

FIG. 9 shows a schematic cross-sectional view along line A-A in the region of an insertion portion of the solder pin;

FIG. 12 shows a schematic view during placement of a component on a structural unit using a placement machine.

DETAILED DESCRIPTION

Figure 1:
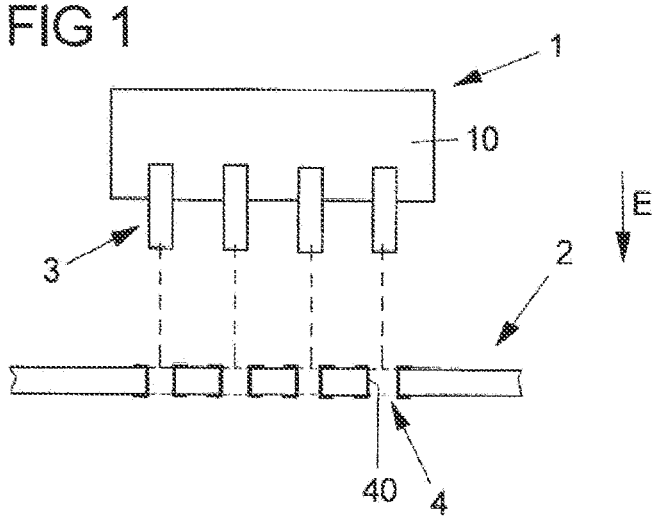
FIG. 1 shows a view of an assembly having a component and an electrical structural unit in the form of a printed circuit board.

In an embodiment, the present invention provides an assembly and a method for producing an assembly which, in a structurally simple manner, enable the production of a soldered joint for fastening a component to an electrical structural unit, in particular a printed circuit board, while reducing tolerances in positional deviation.

Accordingly, the solder pin has an insertion portion which, on sides of the solder pin that face away from one another, forms insertion walls which are arranged at an acute angle to one another in such a way that the insertion portion tapers in the insertion direction, wherein, when the soldered joint is produced between the solder pin and the soldering point, a part of the insertion portion is arranged outside the opening in such a way that some portions of the insertion walls extend inside the opening and some portions of the insertion walls extend outside the opening.

The solder pin has an insertion portion. The insertion portion has a tapered shape in the insertion direction and serves to center the solder pin in an associated opening of a soldering point. In order to produce a soldered joint, the solder pin is inserted with its insertion portion into the opening of the associated soldering point, wherein the solder pin can automatically center itself in the opening due to the tapered shape of the insertion portion.

Due to the centering effect of the insertion portion, tolerances in the position between the solder pin and the soldering point can be reduced so that the accuracy for positioning a component on an associated electrical structural unit, for example a printed circuit board, can be improved. During insertion of a solder pin into an opening of an associated soldering point, the insertion portion with its insertion portions can run onto a surrounding rim of the opening of the soldering point so that the solder pin is automatically centered in the opening thereby.

In the inserted position, when the soldered joint has been produced, the insertion portion is not completely but only partially inserted into the opening of the soldering point. The insertion portion is designed such that, in the inserted position, it projects from the soldering point with one part counter to the insertion direction and, with this part, is not inserted into the opening of the soldering point so that the insertion walls extending at an angle to one another are also still located partially outside the opening of the soldering point.

In the inserted position, the insertion walls can both be in abutment with a surrounding rim of the opening of the soldering point, which makes it possible to center the solder pin completely within the opening of the soldering point during production of the soldered joint. However, it is also possible that, in the inserted position, corresponding to a predetermined target position of the component relative to the structural unit, the insertion walls are at a slight distance from a surrounding rim of the opening of the soldering point. In this case, a part of each insertion wall projects outward from the opening counter to the insertion direction so that the insertion portion is not completely inserted into the opening even in the inserted position.

It may be advantageous in this case that there is no direct contact between the solder pin and the soldering point in a nominal target position of the component relative to the structural unit, realized for example by a printed circuit board, in that the insertion walls on the insertion portion of the solder pin are not in abutment with the soldering point. In a nominal target position, the solder pin is thus inserted without contact into the opening of the soldering point before the soldered joint is produced, and is first connected to the soldering point via the soldered joint but without any direct abutment of the insertion walls on a wall of the soldering point (which can be designed, for example, as a through-connection extending through the structural unit in the form of the printed circuit board).

In particular, it can be advantageous in this case if, during placement of the component on the structural unit and the associated insertion of the solder pin of the component into an associated opening of a soldering point of the structural unit, the solder pin does not jam in the soldering point but is inserted essentially without force, i.e., with clearance, into the opening of the soldering point. During placement, this can be advantageous in order to prevent the component during placement from disengaging from a placement machine which grips the component with, for example, a gripping device in the form of a suction device under the action of a negative pressure and in this way places it on the structural unit. By positioning the component without force on the structural unit by inserting the solder pin without force into the associated soldering point of the structural unit, a force action between the placement machine and the component can be prevented so that the component is prevented from detaching from the placement machine in an undesired manner.

If the solder pin is positioned at the associated soldering point (slightly) outside the nominal target position, the solder pin can automatically center itself in the opening of the solder pin by interaction of the insertion walls of the insertion portion with wall portions of the soldering point, wherein however this takes place essentially without force and in particular does not lead to jamming of the solder pin in the opening of the soldering point.

In one embodiment, the component has a housing and at least one positioning element arranged on the housing, which positioning element is in abutment with a surface of the structural unit (for example, a printed circuit board) when the component is positioned on the structural unit. The position of the component relative to the printed circuit board, in particular along the insertion direction, i.e., perpendicular to an extension plane of the structural unit formed, for example, by a printed circuit board, is thus predetermined by the positioning element so that the insertion depth of the solder pin in the soldering point is determined by the positioning element. In the position predetermined by the positioning element, the solder pin engages with the insertion portion in the opening of the associated soldering point but, in a nominal target position, is not in abutment with a wall portion of the soldering point.

The at least one positioning element can be formed by a portion projecting from the housing. However, the at least one positioning element can also be formed by a housing portion of the housing itself, wherein one or more solder pins are clear of the positioning element via a recess, for example.

In one embodiment, the acute angle at which the insertion walls of the insertion portion extend to one another has a value between 5° and 30°, for example 10°. The insertion portion thus tapers in the insertion direction and comes to a point in the insertion direction, which enables the solder pin to be centered, essentially without force, in the opening of the associated soldering point when the component is being positioned at the associated electrical structural unit.

In one embodiment, the solder pin has a head which the insertion portion adjoins in the insertion direction. The head can have larger dimensions than the insertion portion and thus project transversely to the insertion portion, in particular along a transverse direction which extends transversely to the insertion direction and along which the insertion walls are also spaced apart from one another. The solder pin can, for example, be connected to the associated component via the head.

For example, the head has walls extending in parallel to one another and transition slopes adjoining the walls in the insertion direction. The insertion walls adjoin the transition slopes, which extend obliquely to the insertion direction, wherein, due to the transition slopes, the insertion walls at their ends facing the head are offset inward relative to the walls of the head (in relation to the transverse direction).

In one embodiment, the opening of the soldering point has a clear width that is smaller than a breadth of the head measured between the walls. Insertion of the head of the solder pin into the opening of the associated soldering point is thus excluded.

In one embodiment, the transition slopes are arranged at an angle to one another that is greater than the acute angle between the insertion walls. The angle between the transition slopes may, for example, be in a range between 60° and 120°, such as 90°. The transition slopes represent a transition between the insertion walls extending at an acute angle to one another and the walls of the head extending in parallel to one another.

In one embodiment, the solder pin has a shaft portion which adjoins the insertion portion in the insertion direction and has shaft walls which adjoin the insertion walls of the insertion portion and extend in parallel to one another. A shaft portion, which in turn forms shaft walls extending in parallel to one another, thus adjoins the insertion portion that tapers in the insertion direction. With the shaft portion, the solder pin can, for example, protrude in the inserted position from the opening of the soldering point in the insertion direction on the side facing away from the head. By visual inspection (for example, using a camera) of the shaft portion after the soldered joint has been produced, it is thus also possible to check the connection between the component and the structural unit.

In one embodiment, the solder pin also has an end portion which adjoins the shaft portion and comes to a point in the insertion direction. Such an end portion that comes to a point can facilitate the insertion of the solder pin into the opening of an associated soldering point because the solder pin can be more easily brought into engagement with the opening of the soldering point.

The solder pin can be shaped differently in a cross-sectional plane transverse to the insertion direction.

For example, the solder pin can have a rectangular basic shape in cross-section transverse to the insertion direction. In this case, the solder pin can be formed, for example, as a stamped part from a metal sheet.

Alternatively, the solder pin can, for example, be rotationally symmetrical in cross-section transverse to the insertion direction and thus have a conical shape at its insertion portion.

In this case, the solder pin is integrally formed from one piece.

If the solder pin is rectangular in cross-section, the solder pin can have, for example, flanks which are spaced apart from one another along a depth direction and preferably extend in parallel to one another. The depth direction is directed transversely to the insertion direction and transversely to the transverse direction along which the insertion walls are spaced apart from one another. The solder pin can have a thickness measured along the depth direction that is smaller than the breadth of the solder pin, in particular in the region of the head, so that the solder pin has a flat basic shape.

The flanks may preferably extend over the entire height of the solder pin and may be aligned in parallel to one another over the entire height of the solder pin.

In one embodiment, the insertion portion has chamfers at the transition between the insertion walls spaced apart from one another along the transverse direction and the flanks spaced apart from one another along the depth direction, edges being beveled at the transitions in the region of said chamfers. The chamfers may, for example, extend along the entire height of the insertion portion and also on the shaft portion and on the end portion adjoining thereto, so that edges of the solder pin are beveled in order to facilitate insertion into the opening of an associated soldering point.

In one embodiment, the opening of the soldering point is round, for example circular, in cross-section transverse to the insertion direction. The shape of the opening thus differs from the shape of the solder pin. During insertion of the solder pin into the opening of an associated soldering point, the insertion walls can be in abutment with a rim surrounding the opening, in particular at an edge surrounding the opening at an entrance of the opening into which the solder pin is inserted in the insertion direction during insertion into the opening. By running onto the rim surrounding the opening, the solder pin is automatically centered in the opening so that the solder pin with low tolerances assumes a desired position within the opening of the solder pin. In a nominal target position, however, it can be provided in this case that there is no contact between the solder pin and surrounding wall portions of the soldering point so that during placement, the solder pin can be inserted into the opening of the soldering point without force, and a connection between the solder pin and the soldering point is first established by the soldered joint.

In an embodiment, the present invention provides a method for producing an assembly, comprising: populating an electrical structural unit with a component using a placement machine for gripping the component, wherein, during placement, a solder pin arranged on the component is inserted into an opening of a soldering point arranged on the electrical structural unit, along an insertion direction in order to produce a soldered joint. In this case, it is provided that the solder pin is inserted into the opening in such a way that a part of an insertion portion of the solder pin is arranged outside the opening when the soldered joint has been produced between the solder pin and the soldering point, wherein the insertion portion, on sides of the solder pin that face away from one another, forms insertion walls which are arranged at an acute angle to one another in such a way that the insertion portion tapers in the insertion direction, wherein some portions of the insertion wall of the insertion portion extend inside the opening and some portions of the insertion wall of the insertion portion extend outside the opening.

In particular, it can be provided in this case that, when populating the structural unit with the component, the solder pin is inserted into the associated opening of the soldering point such that there is initially no contact between the solder pin and the soldering point and the solder pin is first connected to the soldering point by the soldered joint. In a nominal target position, the solder pin can thus be inserted into the opening without force, without there being any contact with the soldering point during insertion.

In this case, an insertion depth for the solder pin can be predetermined via a positioning element on a housing of the component, which positioning element, when populating the structural unit with the component, comes into abutment with the structural unit, realized for example by a printed circuit board, so that the position of the component relative to the structural unit along the insertion direction is thereby set.

Otherwise, reference is also made to the advantages and advantageous embodiments described above, which also apply analogously to the method.

Figure 2:
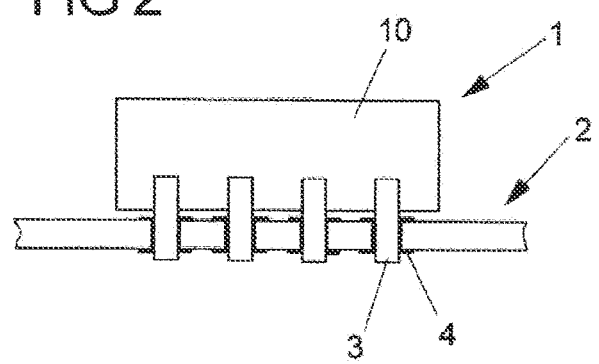
FIG. 2 shows a view of the assembly with a component arranged on the electrical structural unit.

FIGS. 1 and 2 show in schematic views an assembly which has a component 1, for example in the form of a plug-in connector, which is to be positioned on and fixed to an electrical structural unit 2, for example in the form of a printed circuit board.

The component 1 has a housing 10 which encloses electrical or electronic functional components of the component 1. Solder pins 3 are connected to the electrical functional components of the component 1 and are used for mechanical and electrical connection to the electrical structural unit 2.

The electrical structural unit 2 has soldering points 4, each of which forms an opening 40 into which an associated solder pin 3 of the component 1 is to be inserted along an insertion direction E in order to produce soldered joints between the solder pins 3 and the soldering points 4.

While FIG. 1 shows the assembly before connection of the component 1 to the electrical structural unit 2, FIG. 2 shows the component 1 in a position placed onto the structural unit 2, in which position the solder pins 3 engage in the openings 40 of the soldering points 4 and can be connected to the soldering points 4 via soldered joints.

Figure 3:
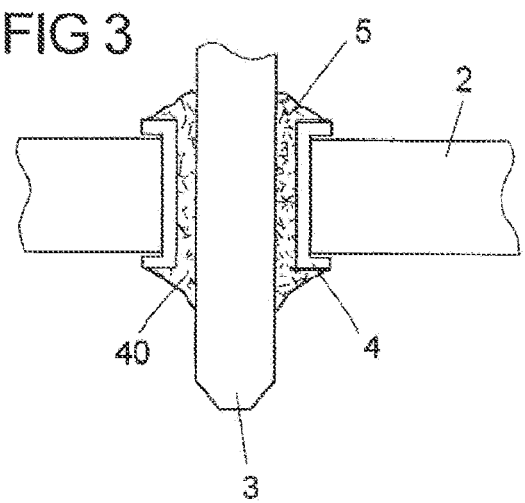
FIG. 3 shows a schematic view of a conventional solder pin in an opening of a soldering point after a soldered joint has been produced.
Figure 4:
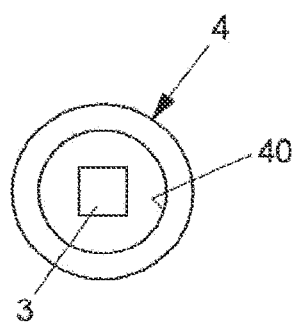
FIG. 4 shows a schematic cross-sectional view of the solder pin in the opening.

As shown in the schematic views according to FIGS. 3 and 4, a solder pin 3 conventionally has a quadrangular, for example rectangular or square, basic shape. In contrast, the opening 40 of a soldering point 4 is usually round in shape, wherein the clear width of the opening 40 is larger than the maximum dimension of the solder pin 3 (measured in cross-section transverse to the device E corresponding to the diagonal of the quadrangular shape of the solder pin 3).

The overdimensioning of the opening 40 is necessary to enable easy insertion of the solder pins 3 of a component 1 without force into associated soldering points 4, in particular using a placement machine. However, the differences in the dimensions create a clearance of the solder pins 3 in the openings 40 of the soldering points 4, which can result in positional deviations from a target position of the component 1 on the structural unit 2 possibly occurring during the production of a soldered joint 5 (shown schematically in FIG. 3) so that under certain circumstances, the component 1 may, for example, not be arranged in parallel to a printed circuit board edge of the structural unit 2 taking the form of a printed circuit board.

In order to reduce tolerances in the positioning of a solder pin 3 in an opening 40 of an associated soldering point 4 and thus to improve the accuracy of the positioning of a component 1 on an electrical structural unit 2, for example in the form of a printed circuit board, a solder pin 3 shown in FIGS. 5 to 9 in one exemplary embodiment has an insertion portion 31 which forms insertion walls 310 aligned at an acute angle $\alpha$ to one another and tapers in the insertion direction E due to the oblique extension of the insertion walls 310. During insertion of the solder pin 3 into an associated opening 40 of a soldering point 4, insertion walls 310 of the insertion portion 31 can interact in particular with a rim portion 41 of the soldering point 4 so that the solder pin 3 automatically centers within the opening 40 during insertion in the insertion direction E and thus assumes a desired, centered position in the opening 40.

During insertion of the solder pin 3 in the insertion direction E into the opening 40 of the associated soldering point 4, the insertion walls 310 can run onto the rim portion 41 of the soldering point 4 so that the solder pin 3 is offset in the opening 40 along a plane defined by a transverse direction Q and a depth direction T and is thus centered in the opening 40. In an inserted position, shown in FIGS. 6 and 8, however, the insertion portion 331 is not completely inserted into the opening 40 but with one part still protrudes from the opening 40 and counter to the insertion direction E. The insertion portion 31 with the insertion walls 310 is thus not completely but only partially inserted into the opening 40 during insertion of the solder pin 3 into the opening 40, until a desired position in the opening 40 is reached.

In this case, it can be advantageous that in a nominal target position, the solder pin 3 is inserted without contact into the opening 40 of the associated soldering point 4; thus, in an ideal, nominal placement process, no contact occurs between the solder pin 3 and the soldering point 4. Only if tolerances exist and the solder pin 3 is positioned outside its nominal target position on the associated soldering point 4, the insertion walls 310 of the insertion portion 31 can come into abutment with a circumferential edge 410 of the rim portion 41 so that the solder pin 3 can thereby center itself in the opening 40 essentially without force.

The solder pin 3 has a head 30 which adjoins the insertion portion 31 counter to the insertion direction E. In contrast, in the insertion direction E, the insertion portion 31 transitions into a shaft portion 32, which in turn adjoins an end portion 33 that comes to a point.

As shown in particular in FIGS. 7 and 8, and in the cross-sectional view according to FIG. 9, the solder pin 3 has flanks 312 which are spaced apart from one another along the depth direction T and extend in parallel to one another and over the entire height of the solder pin 3. The solder pin 3 can, for example, be produced as a stamped and bent part from a metal sheet and has a flat basic shape with dimensions that are smaller in the depth direction T than in the transverse direction Q.

Along the transverse direction Q, the head 30 has walls 300 which are spaced apart from one another and which extend in parallel to one another. At the transition between the head 30 and the insertion portion 31, transition slopes 31 are formed that extend at an angle $\beta$ to one another, which is (significantly) greater than the angle $\alpha$ between the insertion walls 310.

While the angle α at which the insertion walls 310 extend to one another can, for example, have a value between 5° and 30°, for example 10°, the angle β can, for example, have a value between 60° and 120°, for example 90°.

Figure 5:
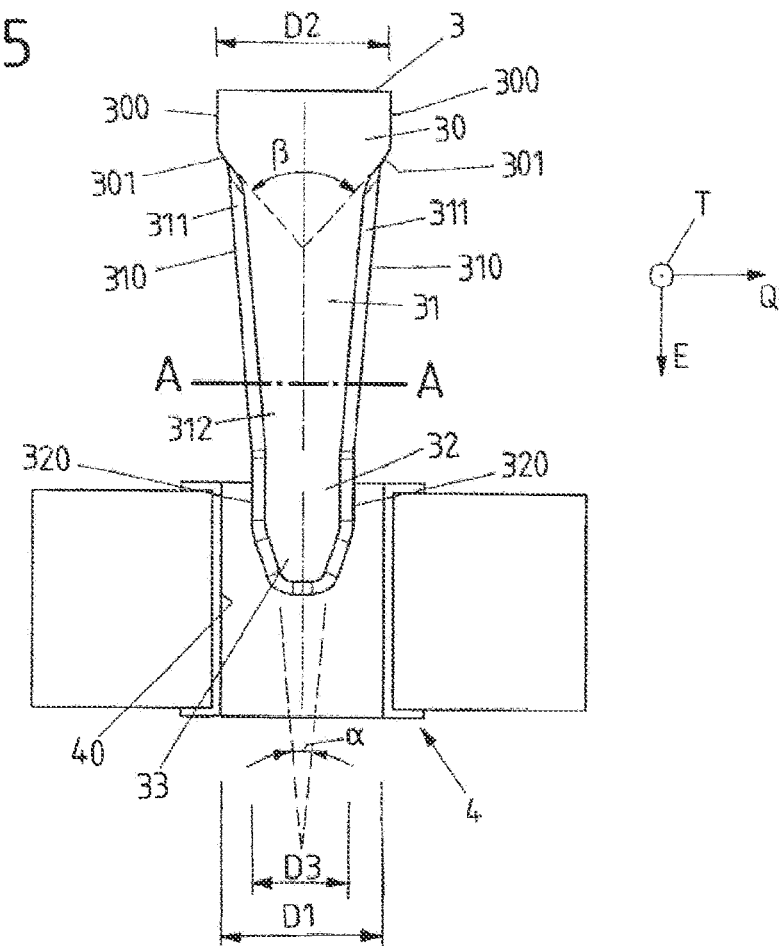
FIG. 5 shows a view of an exemplary embodiment of a solder pin before insertion into an opening of an associated soldering point.

Due to the shape of the transition slopes 101, the insertion walls 310 at their ends facing the head 30 are each offset inward along the transverse direction Q in relation to the walls 300 of the head 30, as shown in particular in FIG. 5.

While the insertion walls 310 of the insertion portion 31 extend at an acute angle α to one another and the insertion portion 31 thus tapers in the insertion direction E, the shaft portion 32 adjoining the insertion portion 31 has shaft walls 320 extending in parallel to one another and spaced apart from one another along the transverse direction Q.

The end portion 33 in turn tapers in relation to the shaft walls 320 of the shaft portion 32.

Chamfers 311 are formed at the transition between the insertion walls 310 and the shaft walls 320 and also the walls of the end portion 33 on the sides of the solder pin 3 that face away from one another along the transverse direction Q, and the flanks 312 on the sides of the solder pin 3 that face away from one another along the depth direction T, by means of which chamfers the solder pin 3 is beveled at the transitions between the different sides, as shown in FIGS. 7 and 8 when viewed together with FIG. 9. The solder pin 3 thus does not form any sharp edges in the region of the insertion portion 31, of the shaft portion 32, and of the end portion 33 but is beveled in the region of the edges, which further facilitates the insertion and centering of the solder pin 3 in the opening 40 of the associated soldering point 4.

As shown in FIG. 5, the opening 40 of the soldering point 4 has a clear width D1 which is smaller than the breadth D2 of the head 30, measured between the walls 300 extending in parallel to one another along the transverse direction Q. The breadth D3 of the shaft portion 32, measured between the shaft walls 320, is in contrast significantly smaller than the clear width D1 of the opening 40 so that the solder pin 3 with the shaft portion 32 can easily be inserted into the opening 40 of an associated soldering point 4 in order to then be centered via the insertion portion 31 in the opening 40 during insertion.

When the solder pin 3 has been inserted, a soldered joint 5 (as schematically shown in FIG. 3) can be produced between the solder pin 3 and the soldering point 4. For this purpose, the soldering point 4 can have a metal sleeve in the manner of a through-connection with which the solder pin 3 can be connected mechanically and electrically via the soldered joint 5.

A solder pin 3 of the type described is particularly suitable for the use of THR technology. In order to produce soldered joints 5, a solder paste is introduced into the openings 40 of the soldering points 4 before the solder pins 3 are inserted into the openings 40. Once the solder pins 3 are inserted, the solder of the solder paste is melted in a reflow oven so that the solder pins 3 are soldered to the soldering points 4.

Figure 10:
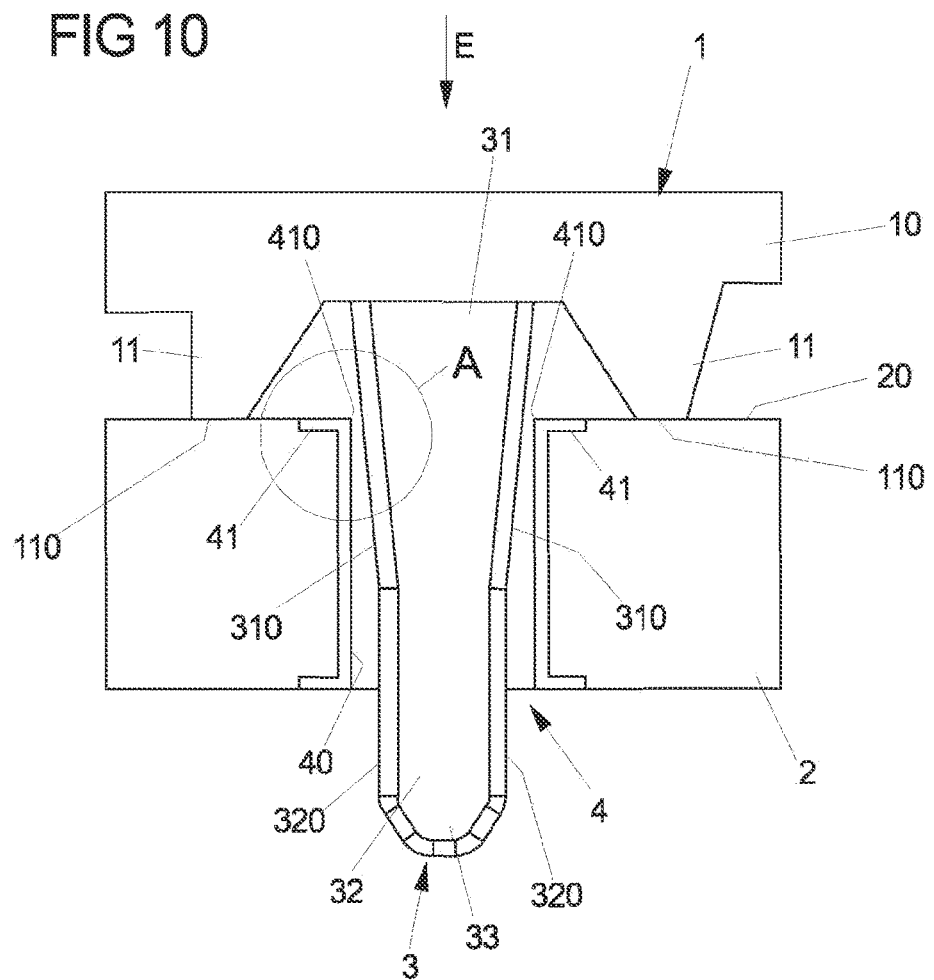
FIG. 10 shows a view of an exemplary embodiment of a component on an associated structural unit in the form of a printed circuit board, with an arrangement of positioning elements on a housing of the component.
Figure 11:
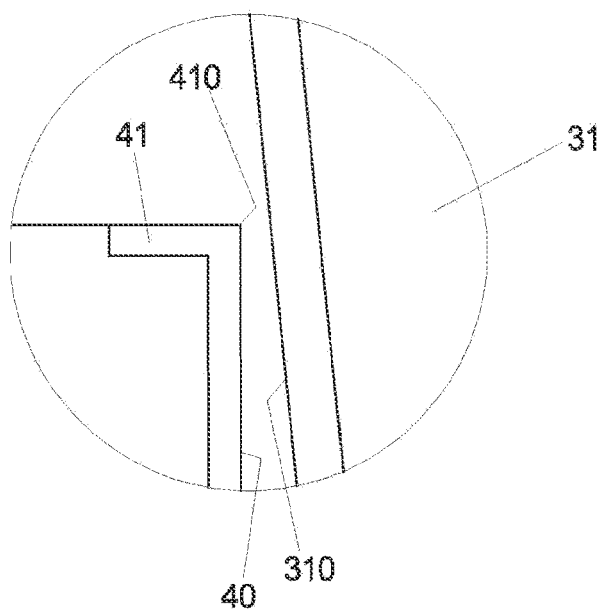
FIG. 11 shows an enlarged view in section A according to FIG. 10.

In an exemplary embodiment shown in FIGS. 10 and 11, a solder pin 3, which is functionally similar to the solder pin 3 described above with reference to FIGS. 5 to 9, is arranged on a housing 10 of a component 1 which is to be arranged as an electrical or electronic functional component on a structural unit 2 in the form of a printed circuit board.

In the exemplary embodiment shown in FIGS. 10 and 11, positioning elements 11 are formed on the housing 10 and serve as spacers for defining a height position relative to the structural unit 2 in the form of the printed circuit board and, for this purpose, project along the insertion direction E from the housing 10 in the direction of the structural unit 2. When the component 1 is positioned on the structural unit 2, on the sides of the positioning elements 11 that face away from the housing 10, the positioning elements 11 with positioning surfaces 110 are in abutment with a surface 20 of the structural unit 2 so that the insertion depth of the solder pin 3 in the opening 40 of the associated soldering point 4 is defined thereby.

The positioning elements 11 can be designed as projection elements formed on the housing. However, it is also conceivable and possible to form one or more positioning elements 11 by means of a flat housing portion, i.e., by the housing 10 itself, in particular by an underside of the housing 10, wherein, in this case, the solder pin 3 is arranged, for example, in a recess in the manner of a groove or a depression in the region of the underside of the housing 10 and is thereby clear of the positioning elements 11.

Figure 6:
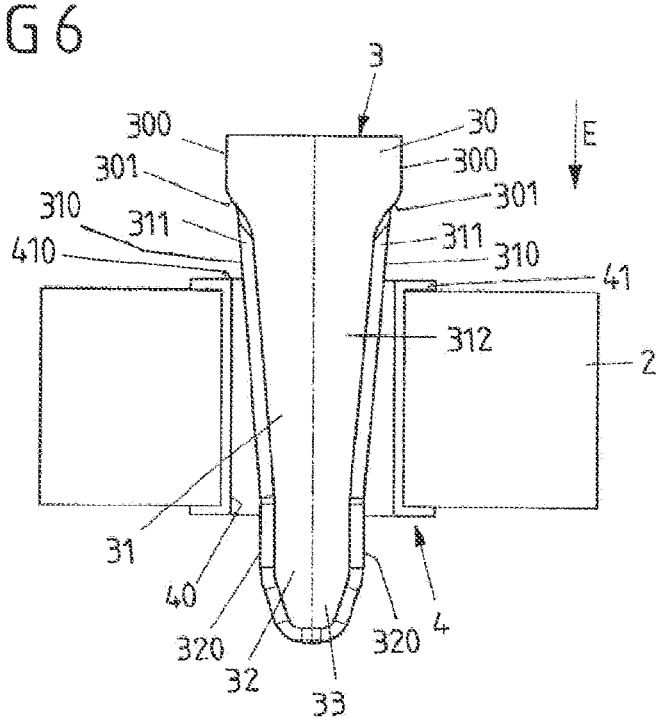
FIG. 6 shows a view of the solder pin in the inserted position.

As shown in FIG. 10 and the enlarged view according to FIG. 11, and in addition also in the view according to FIG. 6 for the exemplary embodiment according to FIGS. 5 to 9, in a nominal target position when a component 1 is positioned on the structural unit 12, the solder pin 3 is not in abutment with wall portions of the soldering point 4 formed as a through-connection, in particular with a circumferential inner edge 410 of the upper rim portion 41 of the soldering point 4. Thus, during placement of the component 1 on the structural unit 2, when the component 1 is positioned on the structural unit 2 according to a defined target position, the solder pin 3 with the insertion walls 310 on the insertion portion 31 does not come into abutment with the soldering point 4, wherein the insertion portion 31 comes to lie partially in the opening 40 of the soldering point 4 and partially outside the opening 40.

Due to tolerances, for example in the arrangement of the solder pin 3 on the housing 10 and also in the arrangement of multiple solder pins 3 of the component 1 with respect to one another, deviations from the target position of the solder pin 3 relative to the soldering point 4 can occur. In this case, the solder pin 3 can run with one or both insertion walls 310 onto the circumferential inner edge 410 of the rim portion 41 and thus center itself in the opening 40, wherein this takes place essentially without force and no jamming effect occurs between the solder pin 3 and the soldering point 4 when the solder pin 3 is positioned on the soldering point 4.

Populating the structural unit 2 can take place in particular using a placement machine 6, as shown schematically in FIG. 10. As part of a placement process, a component 1 can be gripped with a gripping device 60 of the placement machine 6, for example under the action of a negative pressure, in order to position the component 1 on the associated structural unit 2 and to thereby bring solder pins 3 of the component 1 into engagement with associated soldering points 4 on the structural unit 2.

Because the placement process, in particular the insertion of the solder pins 3 into openings 40 of the associated soldering points 4, takes place essentially without force, a force action can be prevented from occurring on the component 1 during placement, which force action could lead to the component 1 detaching from the gripping device 60 of the placement machine 6.

When the component 1 has been positioned on the structural unit 2, soldered joints 5 are produced between the solder pins 3 and the associated soldering points of the printed circuit board 2 in order to in this way electrically connect the component 1 to the structural unit 2 and also to mechanically fasten it to the structural unit 2.

The idea behind the invention is not limited to the exemplary embodiments described above but can basically also be implemented in another manner.

A component can be connected via one or more solder pins to an associated electrical structural unit, for example a printed circuit board. THR technology can be used in this case to produce soldered joints, wherein other soldering methods may also be used.

A solder pin can have a flat basic shape, as described with reference to the exemplary embodiment according to FIGS. 5 to 9. Instead, the solder pin can however also have, for example, a rotationally symmetrical basic shape with a conical insertion portion.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Component
10 Housing
11 Positioning element
110 Positioning surface
2 Electrical structural unit (printed circuit board)
20 Surface
3 Solder pin
30 Head
300 Wall
301 Transition slope
31 Insertion portion
310 Insertion wall
311 Chamfer
312 Flank
32 Shaft portion
320 Wall
33 End portion
4 Soldering point (through-connection)
40 Opening
41 Rim portion
410 Edge
5 Soldered joint
6 Placement machine
60 Gripping device
α, β Angle
D1 Width
D2, D3 Breadth
E Insertion direction
Q Transverse direction
T Depth direction

The invention claimed is:

1. An assembly, comprising:
a component,
a solder pin arranged on the component,
an electrical structural unit, and
a soldering point which is arranged on the electrical structural unit and forms an opening, into which the solder pin is insertable along an insertion direction in order to produce a soldered joint,
wherein the solder pin has an insertion portion which, on sides of the solder pin that face away from one another, forms insertion walls which are arranged at an acute angle to one another in such a way that the insertion portion tapers in the insertion direction,
wherein, when the soldered joint has been produced between the solder pin and the soldering point, a part of the insertion portion is arranged outside the opening in such a way that one or more portions of the insertion walls extend inside the opening and one or more portions of the insertion walls extend outside the opening,
wherein the solder pin has a head which the insertion portion adjoins in the insertion direction, and
wherein the head has walls extending in parallel to one another and transition slopes adjoining the walls in the insertion direction, wherein the insertion walls adjoin the transition slopes.

2. The assembly according to claim 1, wherein the insertion walls are not in abutment with the soldering point, wherein the insertion portion is connected to the soldering point of the electrical structural unit exclusively via the soldered joint.

3. The assembly according to claim 1, wherein the component has a housing and at least one positioning element which is arranged on the housing and is in abutment with a surface of the structural unit when the component is positioned on the structural unit.

4. The assembly according to claim 1, wherein the acute angle has a value between 5° and 30°.

5. The assembly according to claim 1, wherein the opening of the soldering point has a clear width which is smaller than a breadth of the head measured between the walls.

6. The assembly according to claim 1, wherein the transition slopes are arranged at an angle to one another that is greater than the acute angle between the insertion walls.

7. The assembly according to claim 1, wherein the opening is round in cross-section transverse to the insertion direction.

8. The assembly according to claim 1, wherein the solder pin has a shaft portion which adjoins the insertion portion in the insertion direction and has shaft walls which extend in parallel to one another and adjoin the insertion walls of the insertion portion.

9. The assembly according to claim 8, wherein the solder pin has an end portion which adjoins the shaft portion and comes to a point in the insertion direction.

10. The assembly according to claim 1, wherein the insertion walls are spaced apart from one another along a transverse direction extending transversely to the insertion direction, wherein the solder pin has flanks which are spaced apart from one another along a depth direction extending transversely to the insertion direction and transversely to the transverse direction.

11. The assembly according to claim 10, wherein the flanks extend in parallel to one another.

12. The assembly according to claim 11, wherein the insertion portion has chamfers at the transition between the insertion walls and the flanks.

13. An assembly, comprising:
a component,
a solder pin arranged on the component,
an electrical structural unit, and
a soldering point which is arranged on the electrical structural unit and forms an opening, into which the solder pin is insertable along an insertion direction in order to produce a soldered joint,
wherein the solder pin has an insertion portion which, on sides of the solder pin that face away from one another, forms insertion walls which are arranged at an acute angle to one another in such a way that the insertion portion tapers in the insertion direction,
wherein, when the soldered joint has been produced between the solder pin and the soldering point, a part of the insertion portion is arranged outside the opening in such a way that one or more portions of the insertion walls extend inside the opening and one or more portions of the insertion walls extend outside the opening, and
wherein the solder pin has a shaft portion which adjoins the insertion portion in the insertion direction and has shaft walls which extend in parallel to one another and adjoin the insertion walls of the insertion portion.

14. The assembly according to claim 13, wherein the solder pin has an end portion which adjoins the shaft portion and comes to a point in the insertion direction.

15. An assembly, comprising:
a component,
a solder pin arranged on the component,
an electrical structural unit, and
a soldering point which is arranged on the electrical structural unit and forms an opening, into which the solder pin is insertable along an insertion direction in order to produce a soldered joint,
wherein the solder pin has an insertion portion which, on sides of the solder pin that face away from one another, forms insertion walls which are arranged at an acute angle to one another in such a way that the insertion portion tapers in the insertion direction,
wherein, when the soldered joint has been produced between the solder pin and the soldering point, a part of the insertion portion is arranged outside the opening in such a way that one or more portions of the insertion walls extend inside the opening and one or more portions of the insertion walls extend outside the opening,
wherein the insertion walls are spaced apart from one another along a transverse direction extending transversely to the insertion direction,
wherein the solder pin has flanks which are spaced apart from one another along a depth direction extending transversely to the insertion direction and transversely to the transverse direction,
wherein the flanks extend in parallel to one another, and
wherein the insertion portion has chamfers at the transition between the insertion walls and the flanks.

\* \* \* \* \*